(12) United States Patent
Alexandrescu et al.

(10) Patent No.: US 12,742,828 B2
(45) Date of Patent: Sep. 22, 2026

(54) DETERMINING STATE OF CHARGE, MOLARITY AND OXIDATION STATE IN A FLOW BATTERY AND CONTROLLING A FLOW BATTERY

(71) Applicant: Largo Clean Energy Corp., Andover, MA (US)

(72) Inventors: Eric Alexandrescu, Watertown, MA (US); Michael L. Perry, Noank, CT (US); Michael T. Falcinelli, Boxford, MA (US)

(73) Assignee: STORION ENERGY LLC., Alpharetta, GA (US)

( * ) Notice: Subject to any disclaimer, the term of this patent is extended or adjusted under 35 U.S.C. 154(b) by 0 days.

(21) Appl. No.: 18/591,461

(22) Filed: Feb. 29, 2024

(65) Prior Publication Data

US 2024/0201271 A1 Jun. 20, 2024

Related U.S. Application Data

(63) Continuation of application No. PCT/US2022/040449, filed on Aug. 16, 2022.

(Continued)

(51) Int. Cl.

*G01R 31/367* (2019.01)
*G01R 31/36* (2020.01)

(Continued)

(52) U.S. Cl.

CPC ....... *G01R 31/387* (2019.01); *G01R 31/3644* (2013.01); *G01R 31/367* (2019.01); *G01R 31/378* (2019.01)

(58) Field of Classification Search

CPC .. G01R 31/387; G01R 31/367; G01R 31/378; G01R 31/3644

(Continued)

(56) References Cited

U.S. PATENT DOCUMENTS 6,359,419 B1 * 3/2002 Verbrugge ............... B60K 6/44 320/132
9,853,310 B2 12/2017 Darling et al.

(Continued)

FOREIGN PATENT DOCUMENTS

CA 3148813 A1 2/2021
DE 102020120428 B3 7/2021

(Continued)

OTHER PUBLICATIONS

Darling, Robert M., et al., Transference Numbers of Vanadium Cations in Nafion, Journal of The Electrochemical Society, 2020 167 020529, 6 pages.

(Continued)

*Primary Examiner* — Huy Q Phan
*Assistant Examiner* — Trung Q Nguyen
(74) *Attorney, Agent, or Firm* — Patterson + Sheridan, LLP

(57) ABSTRACT

A system and method for measuring the state of charge (SOC), molarity and concentrations of active species and oxidation state of a flow battery, such as a Vanadium Redox Flow Battery (VRFB). A reference electrolyte is circulated through a reference cell in conjunction with one or both charged electrolytes (in respective conduits). The electric potential of charged electrolyte relative to a reference electrolyte is measured. This measurement is directly convertible to SOC. An equation allowing for the calculation of the molarity, concentration of vanadium ions on both anolyte and catholyte sides of the flow battery and oxidation state is also taught. A flow battery may be controlled in response to such a determination, for example to manage oxidation state, or to charge or discharge a battery.

17 Claims, 6 Drawing Sheets

Related U.S. Application Data

(60) Provisional application No. 63/240,430, filed on Sep. 3, 2021.

(51) Int. Cl.
*G01R 31/378* (2019.01)
*G01R 31/387* (2019.01)

(58) Field of Classification Search
USPC ...................... 324/500, 600, 76.11, 415–432
See application file for complete search history.

(56) References Cited

U.S. PATENT DOCUMENTS

| | | | | |
|---|---|---|---|---|
| 10,777,836 | B1 * | 9/2020 | Wei | H01M 8/188 |
| 11,005,111 | B2 | 5/2021 | Naitou et al. | |
| 11,949,134 | B2 * | 4/2024 | Klassen | H01M 8/04201 |
| 2007/0072067 | A1 * | 3/2007 | Symons | H01M 8/188 429/105 |
| 2011/0223450 | A1 * | 9/2011 | Horne | B60L 53/30 429/72 |
| 2011/0311896 | A1 | 12/2011 | Harper et al. | |
| 2014/0214348 | A1 * | 7/2014 | Sahinoglu | G01R 31/3842 702/63 |
| 2015/0086896 | A1 | 3/2015 | Chang et al. | |
| 2016/0056487 | A1 | 2/2016 | Darling et al. | |
| 2018/0241107 | A1 * | 8/2018 | Su | H01M 4/368 |
| 2018/0375132 | A1 * | 12/2018 | Li | H01M 8/188 |
| 2019/0280316 | A1 | 9/2019 | Min et al. | |
| 2021/0226239 | A1 | 7/2021 | Underwood et al. | |
| 2024/0176929 | A1 * | 5/2024 | Okabe | H01M 10/4285 |

FOREIGN PATENT DOCUMENTS

| | | | |
|---|---|---|---|
| EP | 3069403 | B1 | 6/2020 |
| JP | H7192748 | A | 7/1995 |
| JP | 2009016217 | A | 1/2009 |
| KR | 1020140016918 | A | 2/2014 |
| KR | 10-2014-0123337 | A | 10/2014 |
| WO | 9003666 | A1 | 4/1990 |
| WO | 2008148148 | A1 | 12/2008 |
| WO | 2021025925 | A1 | 2/2021 |
| WO | 2022084345 | A1 | 4/2022 |

OTHER PUBLICATIONS

Sing, David Charles, et al., Direct Measurement of Vanadium Crossover in an Operating Vanadium Redox Flow Battery, ECS Transactions, 50 (45) 61-72 (2013), 13 pages.

Office Action for Australian Application No. 2022339728 mailed Nov. 28, 2024.

Office Action for Australian Application No. 2022339728 mailed Nov. 20, 2025.

Extended European Search Report for Application No. 22865291.3 mailed Nov. 7, 2025.

Notice of Preliminary Rejection for Korean Application No. 10-2024-7004509 mailed Jan. 6, 2026.

Office Action for Japanese Application No. 2024-513223 mailed Jun. 26, 2026 (8 pages).

* cited by examiner 500
504A
502A
510A
A
508
506A
502B
506B
504B 511A
510A
502A
504A
512
514
516
517A
518A
520A
517B
518B
510B
511B
520A 400A
402
408
404
412
410
406

400B
402
408
404
410
406

400C
402
416A
408
404
416B
410
406

DETERMINING STATE OF CHARGE, MOLARITY AND OXIDATION STATE IN A FLOW BATTERY AND CONTROLLING A FLOW BATTERY

CROSS-REFERENCE TO RELATED APPLICATION

This application is a continuation application of International Application No. PCT/US2022/040449, filed on Aug. 16, 2022, which claims priority to U.S. provisional application No. 63/240,430, filed on Sep. 3, 2021, in the U.S. Patent and Trademark Office, and having the same title herein, the entire contents of which are incorporated by reference herein.

FIELD

This application relates to flow battery systems such as vanadium redox flow battery (VRFB) systems and more particularly to determining state of charge, molarity and oxidation state in a flow battery and controlling a flow battery.

BACKGROUND

Flow batteries, also known as redox flow batteries or redox flow cells, are useful for large-scale energy storage. Flow batteries convert electrical energy into chemical energy for storage and later release as electrical energy when there is demand. Flow batteries use externally-supplied, fluid electrolyte solutions that include reactants which participate in reversible electrochemical reactions. Upon charging, the electrical energy supplied causes a chemical reduction reaction in one electrolyte and an oxidation reaction in the other electrolyte. Upon discharge, the chemical energy contained in the liquid electrolytes is released in reverse reactions and electrical energy can be drawn from the electrodes. The flow batteries can be used in grid-connected energy storage systems and/or in off-grid energy storage systems.

Having an accurate measurement of the state of charge (SOC) of a flow battery is useful to maximize the energy capacity and lifetime of a battery. In a flow battery, it is desired to have a means to accurately measure the concentration of the active materials in the electrolytes. At least some current methods used to measure SOC and concentrations in redox-flow batteries (RFBs) are not robust. For example, optical measurements may be imprecise as optical sensors require frequent maintenance and calibration.

SUMMARY

In accordance with embodiments herein, there is provided a system and method for determining the SOC, molarity and oxidation state of active species of a flow battery, such as a VRFB, in a simple and robust manner. In accordance with the teachings and techniques herein, the electric potential of charged electrolyte relative to a reference electrolyte is measured (e.g. to determine a potential difference). This measurement is directly convertible to SOC. An equation allowing for the calculation of the molarity of vanadium ions on both anolyte and catholyte sides of the system as well as oxidation state therefrom is also taught. A flow battery may be controlled in response to such a determination.

Benefits may include an ability to measure states of charge and molarities of negatively charged electrolyte (anolyte) and positively charged electrolyte (catholyte) independently. Further there may be achieved a significant cost advantage over a current method of measuring SOC, which involves the use of a relatively expensive optical sensor that also requires frequent calibration and maintenance.

There is provided a flow battery comprising: at least one electrochemical battery cell in fluid communication with an anolyte electrolyte and a catholyte electrolyte; a reference cell in fluid communication with at least one of the anolyte electrolyte and the catholyte electrolyte and in fluid communication with a reference electrolyte having a known electric potential, the reference cell to measure at least one of i) an anolyte potential difference, across the reference cell, between the anolyte electrolyte and the reference electrolyte, and ii) a catholyte potential difference, across the reference cell, between the catholyte electrolyte and the reference electrolyte; and a computing device comprising circuitry configured to: process the at least one of the anolyte potential difference and the catholyte potential difference to determine a respective state of charge (SOC) of the anolyte electrolyte and catholyte electrolyte for controlling operation of the flow battery, the computing device determining the respective SOC without a measurement of the potential difference between the anolyte electrolyte and the catholyte electrolyte.

In an embodiment, the computing device is configured to determine the respective SOC in accordance with a Nernst equation of the form $$E = E_0 - \frac{RT}{zF}\ln(Q),$$

where $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

In an embodiment, the computing device is configured to, at least one of: i) store an anolyte look-up table associating anolyte potential difference to anolyte SOC and utilize the look-up table to determine the respective SOC; and ii) store a catholyte look-up table associating catholyte potential difference to catholyte SOC and utilize the look-up table to determine the respective SOC.

In an embodiment, to process the at least one of the anolyte potential difference and the catholyte potential difference to determine the respective state of charge (SOC) defines a first SOC determining option and wherein the computing device is further configured to determine the respective SOC in a second SOC determining option. In an embodiment, in the second SOC determining option, the computing device is configured to perform, one of: determining the respective SOC in response to an optical signal measuring an electrolyte colour; and processing a potential difference between the anolyte and catholyte and determine the respective SOC in response. In an embodiment, the computing device is configured to determine the respective SOC in accordance with the first SOC determining option and if the respective SOC is within a threshold of a high or low value, determine the respective SOC in accordance with the second SOC determining option for use to control the operation of the flow battery.

In an embodiment, the reference cell comprises respective bodies to separately receive electrolyte.

In an embodiment, the reference cell comprises a first reference cell configured to receive one of the anolyte and catholyte and wherein the flow battery comprises a second reference cell, separate from the first reference cell, the second reference cell configured to receive the other one of the anolyte and catholyte. In an embodiment, the first reference cell comprises a first anolyte cell body to separately receive the anolyte electrolyte and a first reference electrolyte cell body to separately receive the reference electrolyte; and wherein a first membrane separates the first anolyte cell body and the first reference electrolyte cell body; and the second reference cell comprises a first catholyte cell body to separately receive the catholyte electrolyte and a second reference electrolyte cell body to separately receive the reference electrolyte; and wherein a second membrane separates the first catholyte cell body and the second reference electrolyte cell body. In an embodiment, the computing device receives measurements of potential differences from each of the first reference cell and the second reference cell. In an embodiment, the flow battery comprises: an anolyte electrolyte loop to circulate the anolyte electrolyte to the at least one battery cell and the first reference cell; a catholyte electrolyte loop to circulate the catholyte electrolyte to the at least one battery cell and the second reference cell; and a reference electrolyte loop to circulate the reference electrolyte to each of the first reference cell and the second reference cell.

In an embodiment, the reference cell is configured for fluid communication with each of the anolyte electrolyte and the catholyte electrolyte; the reference cell comprises a first cell body to separately receive the anolyte electrolyte, a second cell body to separately receive the catholyte electrolyte and at least one additional cell body to separately receive the reference electrolyte; a first membrane separates the first cell body and the at least one additional cell body; and a second membrane separates the second cell body and the at least one additional cell body. In an embodiment, the at least one additional cell body comprises a first additional cell body and a second additional cell body to receive the reference electrolyte and wherein the first additional cell body and a second additional comprise a membrane therebetween. In an embodiment, the flow battery comprises: an anolyte electrolyte loop to circulate the anolyte electrolyte to the at least one battery cell and the first cell body; a catholyte electrolyte loop to circulate the catholyte electrolyte to the at least one battery cell and the second cell body; and a reference electrolyte loop to circulate the reference electrolyte to the at one additional cell body.

In an embodiment, the computing device is further configured to determine molarities and concentrations for electrolyte atoms from SOC.

In an embodiment, a respective molarity of the anolyte and catholyte is determined as:

$$M_{AN} = \frac{I}{FV_{An}\frac{dSOC_{An}}{dt}};\ and\ M_{Ca} = \frac{I}{FV_{Ca}\frac{dSOC_{Ca}}{dt}};$$

wherein: $V$ = Volume; $M$ = Molarity; $I$ = Current;

$SOC$ = State of Charge; $N_A$ = Avagadro's Number;

-continued $C = Coulomb = 6.24 * 10^{18}$ electrons; and $$F = \text{Faraday's constant} = \frac{N_A}{C} = 96485.33\frac{C}{\text{mol}}.$$

In an embodiment, the flow battery comprises a Vanadium Redox Flow Battery (VRFB).

In an embodiment, the anolyte electrolyte and catholyte electrolyte comprise electrolyte solution pairs selected from vanadium, bromine, iron, chromium, zinc, cerium, lead, sulfur, cobalt, tin, and manganese or any suitable combinations thereof.

In an embodiment, the computing device is configured to control the flow battery by at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site.

There is provided a method to control a flow battery. In an embodiment, the method comprises: circulating an anolyte electrolyte and a catholyte electrolyte through at least one electrochemical battery cell; circulating a reference electrolyte having a known electric potential though a reference cell in fluid communication with at least one of the anolyte electrolyte and the catholyte electrolyte; measuring at least one of i) an anolyte potential difference, across the reference cell, between the anolyte electrolyte and the reference electrolyte, and ii) a catholyte potential difference, across the reference cell, between the catholyte electrolyte and the reference electrolyte; and processing the at least one of the anolyte potential difference and the catholyte potential difference to determine a respective state of charge (SOC) of the anolyte electrolyte and catholyte electrolyte for controlling operation of the flow battery, the method determining the respective SOC without a measurement of the potential difference between the anolyte electrolyte and the catholyte electrolyte.

In an embodiment, determine the respective SOC comprises determining the respective SOC in accordance with a Nernst equation of the form $$E = E_0 - \frac{RT}{zF}\ln(Q);$$

where $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

In an embodiment, the method comprises, at least one of: i) storing an anolyte look-up table associating anolyte potential difference to anolyte SOC and utilizing the look-up table to determine the respective SOC; and ii) storing a catholyte look-up table associating catholyte potential difference to catholyte SOC and utilizing the look-up table to determine the respective SOC.

In an embodiment, processing the at least one of the anolyte potential difference and the catholyte potential difference to determine the respective state of charge (SOC)

defines a first SOC determining option and wherein the method further comprises determining the respective SOC according to a second SOC determining option. In an embodiment, according to the second SOC determining option, the method comprises one of: determining the respective SOC in response to an optical signal measuring an electrolyte colour; and processing a potential difference between the anolyte and catholyte and determine the respective SOC in response. In an embodiment, the method determines the respective SOC in accordance with the first SOC determining option and if the respective SOC is within a threshold of a high or low value, determines the respective SOC in accordance with the second SOC determining option for use to control the operation of the flow battery.

In an embodiment, the method further comprises determining at least one molarity for electrolyte atoms from the respective SOC.

In an embodiment, the method comprises controlling operation of the flow battery by at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site.

DETAILED DESCRIPTION

Figure 1:
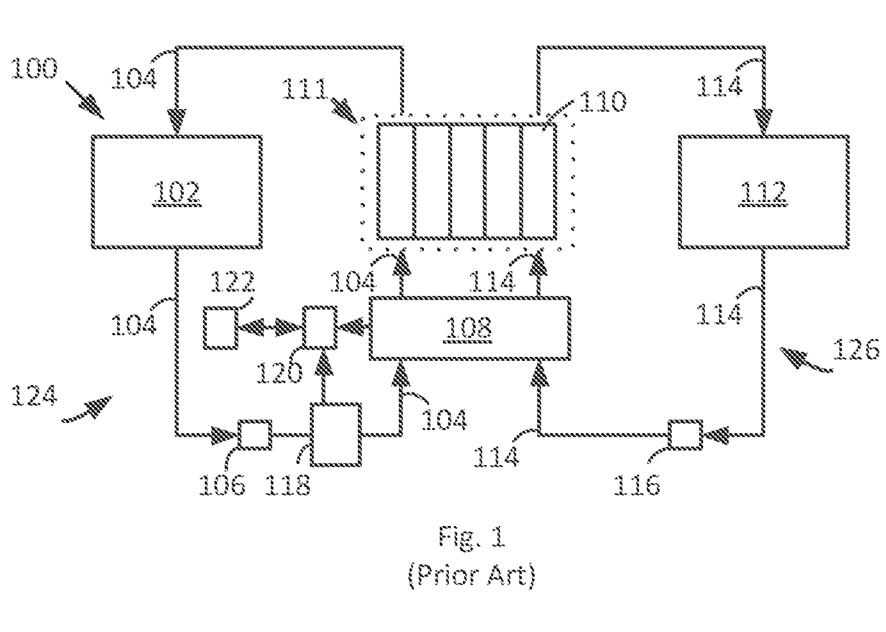
FIG. 1 is a block diagram of a simplified flow battery in accordance with the prior art.

FIG. 1 is a block diagram of a simplified flow battery system 100 in accordance with the prior art. System 100 illustrates a simplified VRFB in which an anolyte (not shown) is circulated from a storage container 102 via piping 104 as assisted and controlled by an anolyte flow regulator 106 (e.g., comprising a pump (not shown)). Piping circulates the anolyte to a reference cell 108 and to one or more flow battery cells (e.g., 110), with two or more cells arranged in a stack 111, before returning the anolyte to container 102. Similarly, a catholyte (not shown) is circulated from a storage container 112 via piping 114 as assisted and controlled by a catholyte flow regulator 116 (e.g., comprising a pump (not shown)). Catholyte is also circulated to the reference cell 108 and stack 111 before returning to container 112.

FIG. 1 also shows an optical sensor 118 coupled to piping 104 for optically measuring the anolyte. The color of the anolyte varies with its oxidation and the optical sensor 118 provides a signal for determining color and inferring a state of charge from the color. The optical sensor 118 is coupled to provide the signal to a data acquisition system 118. Data acquisition system 118 is in communication with a control system 120. Control system 120 may also provide communication functions, for example, communicating locally with components of battery system 100 or with a remote device (e.g., a remove computing device, not shown) or both.

The container 102, piping 104, and flow regulator 106 comprise a first or anolyte electrolyte circulation loop 124. The container 112, piping 114, and flow regulator 116 comprise a second or catholyte electrolyte circulation loop 126.

FIG. 1 is simplified as stated and other components of the battery system 100 may be coupled to the data acquisition system 118 and/or control system 120, as will be understood. For example, not shown are an energy input (e.g., a power source) or an energy output (e.g., an electrical load) or power or control elements coupled to stack 111, among other components. It is understood that the cells 110 discharge or store energy under control of control system 120 according to an electrochemical reaction between the charged electrolytes.

Though not shown, several battery stacks may be connected (in series or parallel) to form a string of stacks in a battery system 100.

In the embodiment of FIG. 1, control system 120 determines the state of charge from the colour data. Control system 120 is configured to control voltage and current (e.g., power) supplied to the battery stack, as examples of controls, in response to the state of charge. Measuring color is imprecise and thus inferring SOC from the detected color is imprecise. Optical sensors require calibration and maintenance and may provide imprecise color measures.

Figure 2:
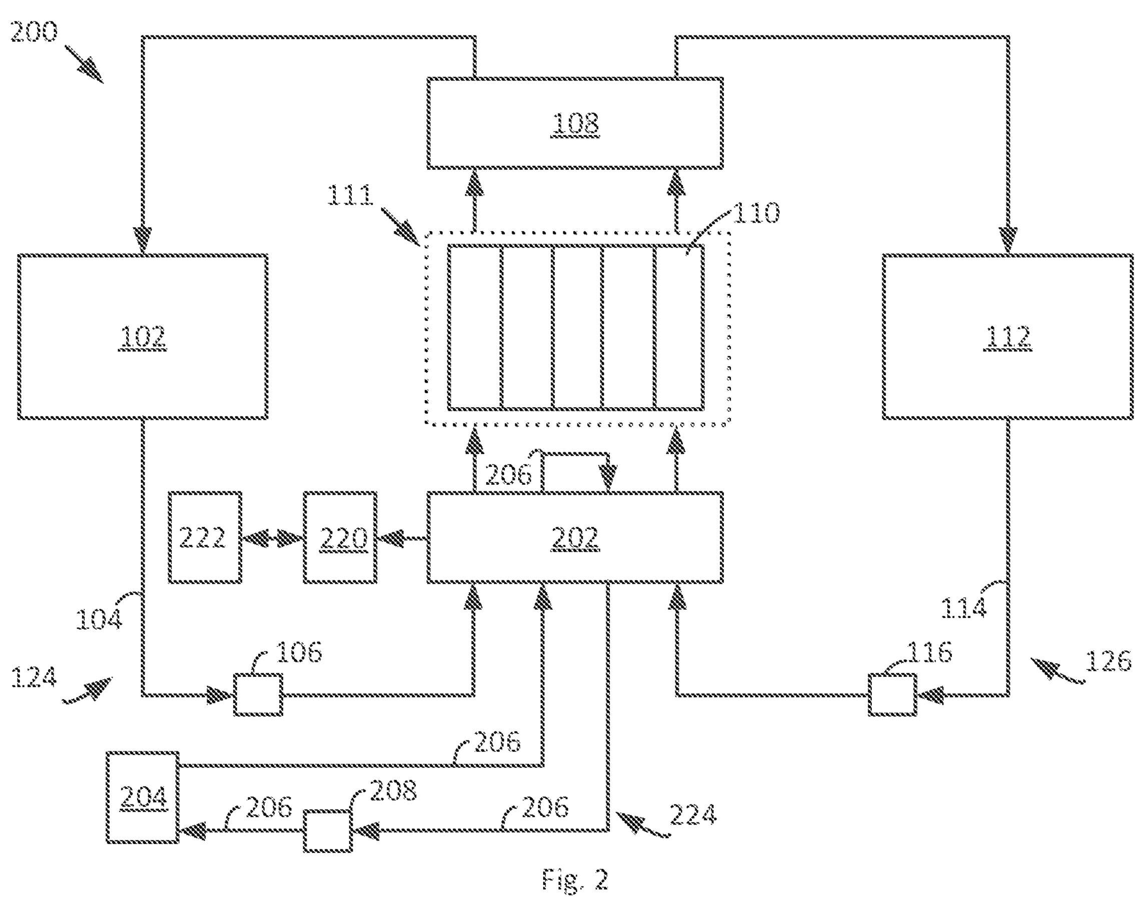
FIGS. 2 and 3 are block diagrams of respective simplified flow battery systems, particularly VRFB systems, in accordance with respective embodiments herein.
Figure 3:
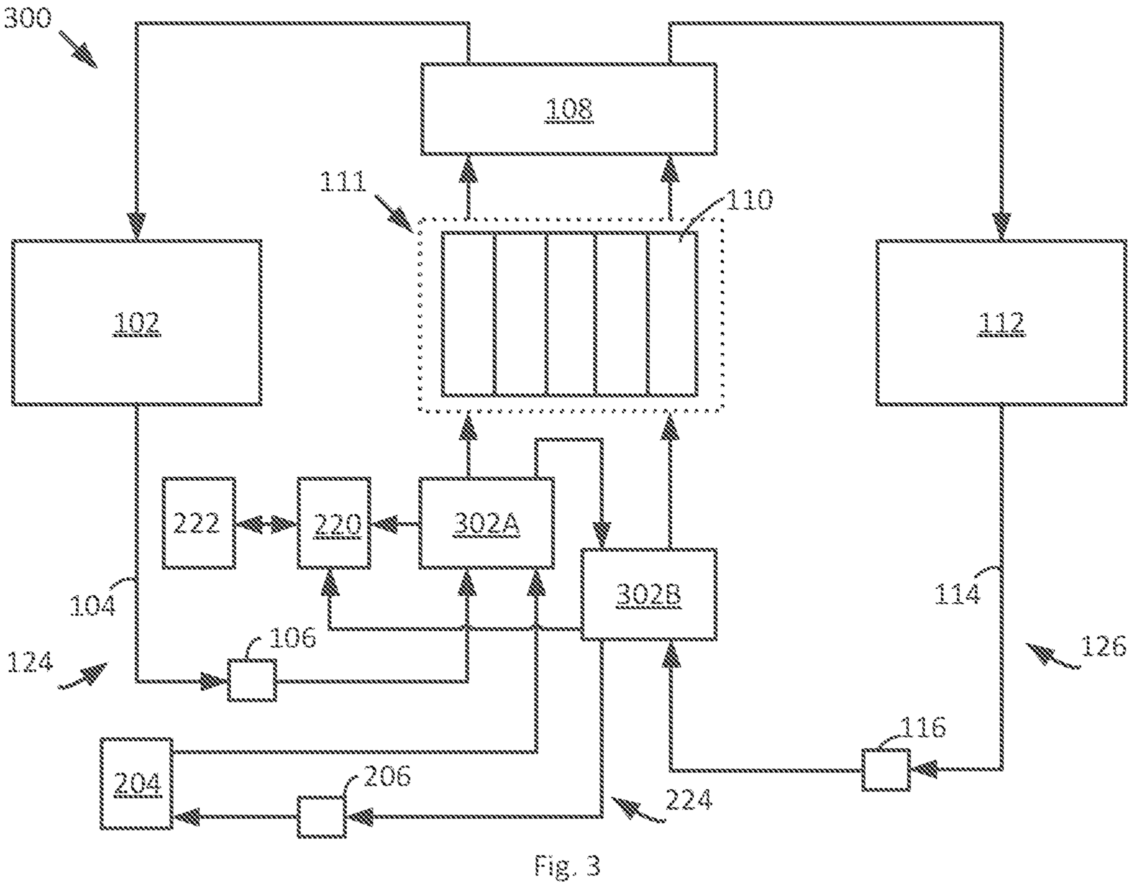

FIGS. 2 and 3 are block diagrams of respective redox flow battery systems 200 and 300, particularly VRFB systems, in accordance with respective embodiments herein. Like components to those of system 100 that form a part of systems 200 and 300 are similarly numbered such as containers 102 and 112, respective piping 104 and 114, reference cell 108, and stacks 110. Piping in systems 200 and 300 may be differently configured to account for a reference cell 202, in accordance with an embodiment, in system 200, and reference cells 302A and 302B, in accordance with an embodiment, in system 300.

In systems 200 and 300, a reference electrolyte (not shown) is circulated from reference electrolyte container 204, via piping 206, as assisted and controlled by reference electrolyte flow regulator 208 (e.g., comprising a pump (not shown)). Reference cell 202 in system 200 is coupled to a data acquisition system 220, which is coupled to control system 222. Reference cells 302A and 302B are coupled to a data acquisition system 220, which is coupled to control system 222. Container 204, piping 206 and flow regulator 208 comprise a third or reference electrolyte circulation loop 224.

Reference cell 202 is coupled to the three electrolytes to enable measurement of the electric potential of the respective charged electrolytes relative to the reference electrolyte. That is, reference cell 202 comprises terminals/coupling for measuring respective potential differences (e.g., 4 in total, comprising two for the anolyte potential and two for the catholyte potential). In system 300, each of reference cells 302A and 302B provides respective terminals/couplings (e.g., two per cell) for a single respective electric potential difference (two terminals in 302A for anolyte/reference electrolyte potential and two terminals in 302B for catholyte/reference electrolyte potential).

In an embodiment, data acquisition system 220 has the same components of data acquisition system 120 but is configured and coupled to measure potential differences (i.e., voltage measurement) as described herein. Similarly, in an embodiment control system 222 has the same components as control system 122 but is configured, such as via programming, in accordance with the teaching and techniques described below herein, to determine SOC. In an embodiment control system 222 may further determine molarity and concentrations of atoms from SOC determinations. Examples of control system configurations include a microprocessor (e.g. central processing unit (CPU) on a chip with interface(s) to RAM/ROM, I/O, peripherals, etc. on other integrated circuits/structures) such as may define a programmable logic controller (PLC), a microcontroller (MCU or microcontroller unit) (e.g. a central processing unit (CPU) with RAM/ROM, peripherals, I/O, on a single chip), a field-programmable gate array (FPGA), and an application-specific integrated circuit (ASIC), etc. Instructions may be stored and executed by a processor, etc. to provide the features and functions of the control system such as determining the SOC, molarity, etc. and controlling the battery (e.g., supply of power thereto) in response to the SOC as determined.

FIGS. 2 and 3 show the respective reference cell 202, and references cells 302A and 302B coupled in the loops 124 and 126 that serve the stack 111. Alternative circulating arrangements are contemplated. In an embodiment (not shown), a respective additional separate loop is coupled to the respective containers 102 and 112 to circulate the respective charged electrolyte to the reference cell(s) without circulating such electrolyte to the stack 111. In an embodiment (not shown), only one of the charged electrolytes is separately circulated in an additional loop. Each additional loop may have its own flow regulator (not shown). In an embodiment (not shown), the charged electrodes are circulated to the reference cell(s) via bypass loops coupled respectively to one of loops 124 and 126 such that the bypass loops run off the same flow regulators (e.g., 106 and 116) as loops 124 and 126 but which bypass loops return the electrolyte to the respective container without circulating through stack 111.

In an embodiment, a plurality of flow battery systems (e.g., each having of one or more stacks defining respective strings, for example) may be coupled, at least for control purposes, to provide a site of a defined size (e.g., 1 MW, 10 MW, etc.). Each string may have a respective control system 222 with a local interface to control the components of the respective string. In an embodiment, control system 222 may be coupled (for example in a network configuration) to a site control system (not shown) to manage battery capacity, etc. on an individual battery basis and/or a site-wide basis. In one example, battery performance is managed by matching SOC in a string of batteries. It is also useful to match SOC of the charged electrolytes in an individual battery system. Thus measuring SOC for each battery stack is useful to manage the batteries individually, in a string or on a site-wide basis.

Figures 4A, 4B, 4C, 5A, 5B:
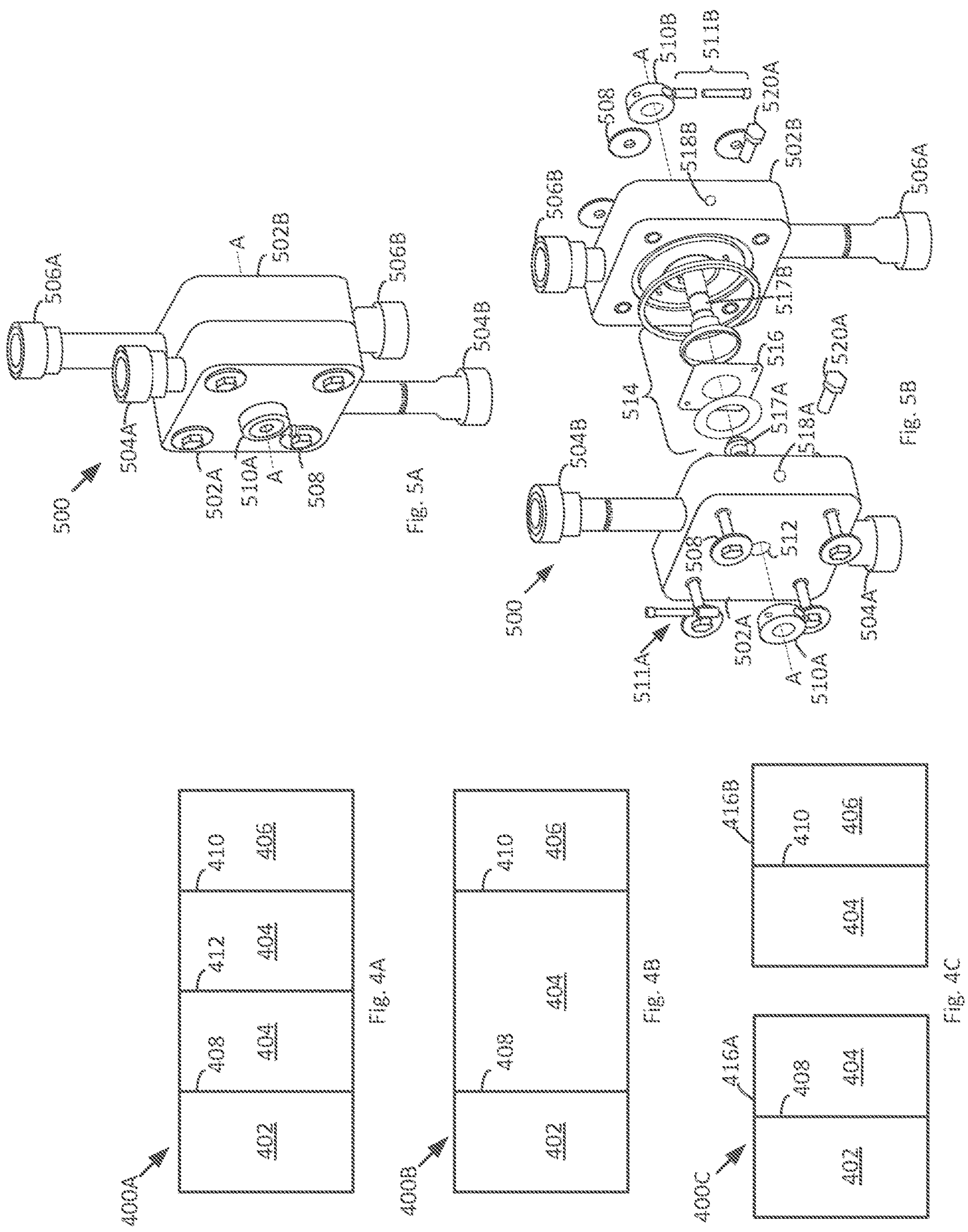
FIG. 4A is a block diagram of a cell configuration for use in a flow battery system.
FIG. 4B is a block diagram of a cell configuration for use in a flow battery system.
FIG. 4C is a block diagram of a cell configuration for use in a flow battery system.
FIG. 5A is an illustration of a reference cell in accordance with an embodiment herein.
FIG. 5B is an exploded view of the reference cell of FIG. 5A.

FIGS. 4A-4C are block diagrams of respective reference cell configurations 400A, 400B, and 400C, in simplified form, for use in a flow battery system, in accordance with respective embodiments herein. For example, reference cell 202 may be configured according to one of configurations 400A and 400B. Reference cells 302A or 302B may be configured as configuration 400C.

Configuration 400A represents an anolyte conduit body 402 for conveying anolyte through the reference cell 400A and past a reference electrolyte conveyed through cell 400A in a reference electrolyte body 404 separated from the anolyte conduit body 402 by membrane 408. Similarly configuration 400A represents a catholyte conduit body 406 for conveying catholyte through the reference cell 400A and past a reference electrolyte conveyed through cell 400A in a reference electrolyte body 404 separated from the catholyte conduit body 402 by membrane 410. In the embodiment of configuration 400A, a reference electrolyte body 400 is divided by a membrane 412. Not shown are terminals to connect wiring with which to measure the respective electric potential differences.

In configuration 400A, potential difference is measured across each of the three membranes. Such measurement enables detection of changes in $V^{3.5+}$ solutions (e.g., due to crossover) by monitoring potential across middle membrane (which is nominally zero).

Configuration 400B is similar to 400A but membrane 412 is not present in conduit body 404. In configuration 400B, potential difference is measured across each of the two membranes.

Configuration 400C, comprising respective cell members 416A and 416B, shows respective conduit bodies 402 and 404 with membrane 408 in a separate cell member 416A from bodies 404 and 406 separated by membrane 410 or cell member 416B. It is understood that in configuration 400C, the cell members 416A and 416B are functionally identical and vary only during use by the charged electrolyte used. Potential difference is measured across each of the two cells members having a membrane each.

FIG. 5A is an illustration of a reference cell 500 in accordance with an embodiment herein and FIG. 5B is an exploded view of the reference cell 500 of FIG. 5A. Reference cell 500 provides an embodiment of configuration 416A or 416B. Reference cell comprises conduit bodies 502A and 502B having respective inlet/outlet pairs 504A/504B and 506A/506B where the respective electrolyte flows into and out of the reference cell 500. In FIGS. 5A and 5B, reference cell 500 is rotated 180 degrees about a central axis A-A and exploded along axis A-A. In an embodiment, the bodies 502A and 502B are made of a plastic material.

The bodies 502A and 502B are coupled together via a plurality of fastener components (e.g., one fastener component 508) each extending therethrough. Each fastener component may comprise, in an example, a threaded fastener such as a bolt, a nut and two washers. Terminals are provided via respective components 510A/511A and 510B/511B having coupling along axis line A-A via aperture 512 and another not visible in body 502B. Between the bodies 502A and 502B is mounted a membrane system 514 including a membrane electrode assembly (not shown) having a proton exchange membrane sandwiched by two electrodes. It is here where the oxidation/reduction reactions take place in the cell. Membrane system 514 may comprise gaskets (e.g., 516) or other sealing devices. Cylindrical bodies 517A and 517B couple a respective electrode of the membrane to a respective terminal (510A/511A and 510B/511B).

In an embodiment, bodies 502A and 502B form side apertures 518A and 518B to receive mounting hardware 520A and 520B respectively. In an embodiment, the mounting hardware are threaded lug bolts or screws such as to mount the cell 500 to a fixture.

As noted, electric potential is measured to determine SOC using an equation. Molarity may also be determined. The following outlines the principles and equation(s) that are used to configure control system 220.

Figure 6:
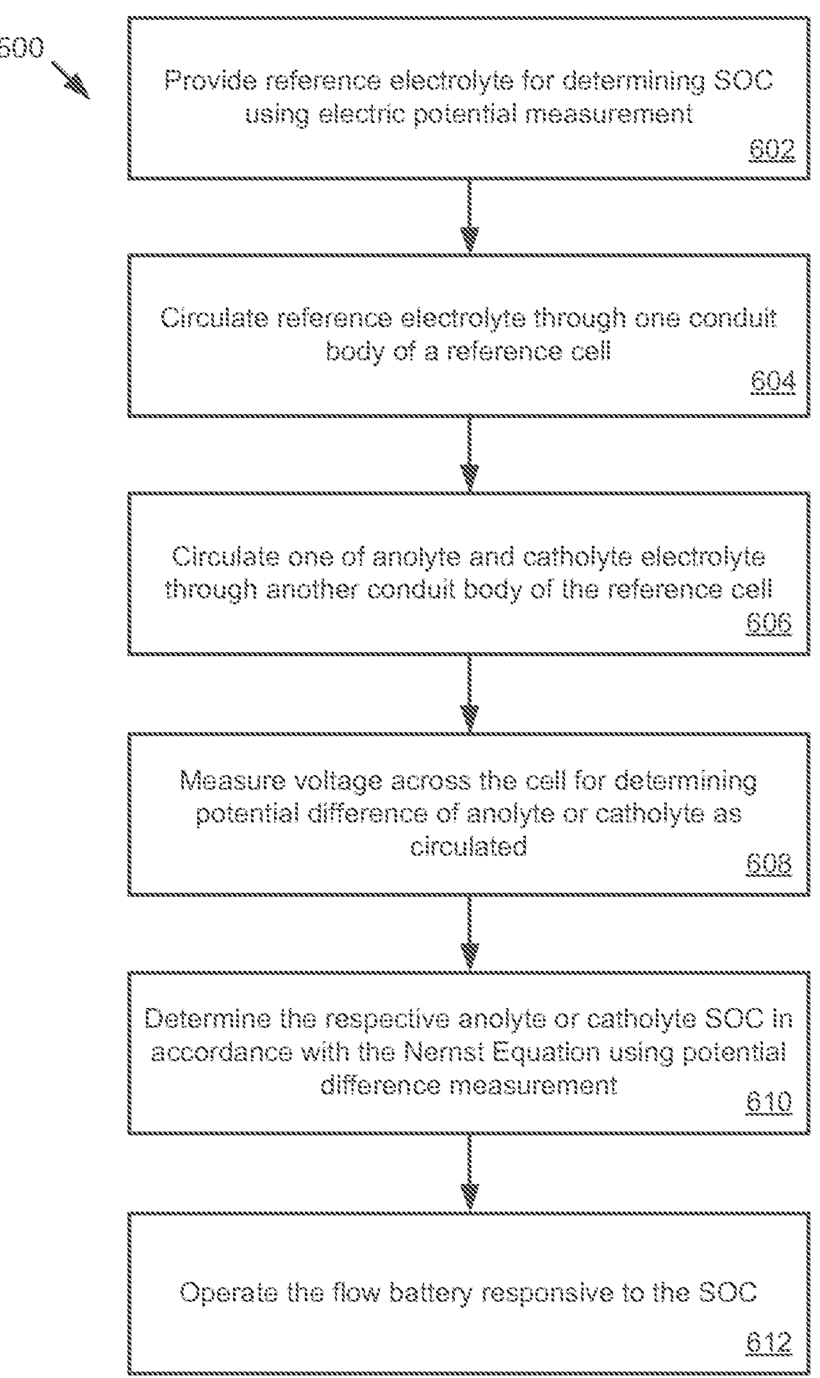
FIG. 6 is a flowchart of operations in accordance with an embodiment herein.

In accordance with an example, the following steps are undertaken, as illustrated in a flowchart of operations 600 in FIG. 6. At 602, reference electrolyte, namely Vanadium (V), particularly $V^{3.5+}$ is provided for determining SOC using electric potential measurements. The reference electrolyte used may optionally be measured ex-situ to the system to determine its composition.

At 604, a closed loop of a volume (e.g., 500 ml) of the titrated $V^{3.5+}$ is circulated through one conduit body of a reference cell (e.g., through body 502B of cell 500). In the other conduit body (e.g., 500A), at 606, one of the charged electrolytes (one of an anolyte and a catholyte electrolyte) is circulated through the reference cell. At 608, the voltage across the cell is measured to determine potential difference (e.g., at the data acquisition system via the respective terminals of the reference cell).

At 610, the control system (a computing device comprising circuitry configured to process the potential difference) uses the measurement to determine the respective anolyte or catholyte SOC in accordance with the Nernst Equation as described further. That is, it determines the SOC without a measurement of the potential difference between the anolyte and catholyte (e.g., across a cell having the anolyte and catholyte separated by a membrane). At 612, control system operates the flow battery responsive to the SOC as determined. Examples of controls include i) controlling power provided to the stack, if charging, ii) controlling power delivered from the stack, if discharging and iii) matching SOC of the electrolytes in the battery.

In an embodiment (not shown), molarity of vanadium species is determined in accordance with a time rate of change of the SOC as described further. The determination of the SOC, as an example, is useful to drive various controls by control system 222.

The Nernst Equation is as follows:

$$E = E_0 - \frac{RT}{zF}\ln(Q), \quad \text{(Eq. 1)}$$

where $E$ = reduction potential; $E_0$ = standard potential;

$R$ = gas constant; $T$ = Temperature; $z$ = ion charge;

$F$ = Faraday's constant; $Q$ = reaction quotient; and $$\frac{RT}{zF} = C.$$

Thus the Eq. 1 may be re-written as:

$$E = E_0 - Cln(Q). \quad \text{(Eq. 2)}$$

SOC Calculations

Completely uncharged electrolyte ($V^{3.5+}$) has a potential of 0.397V relative to S.H.E. (Standard Hydrogen Electrode), such that $E_0$ for $V^{3.5+}$=0.397V.

Figure 7A:
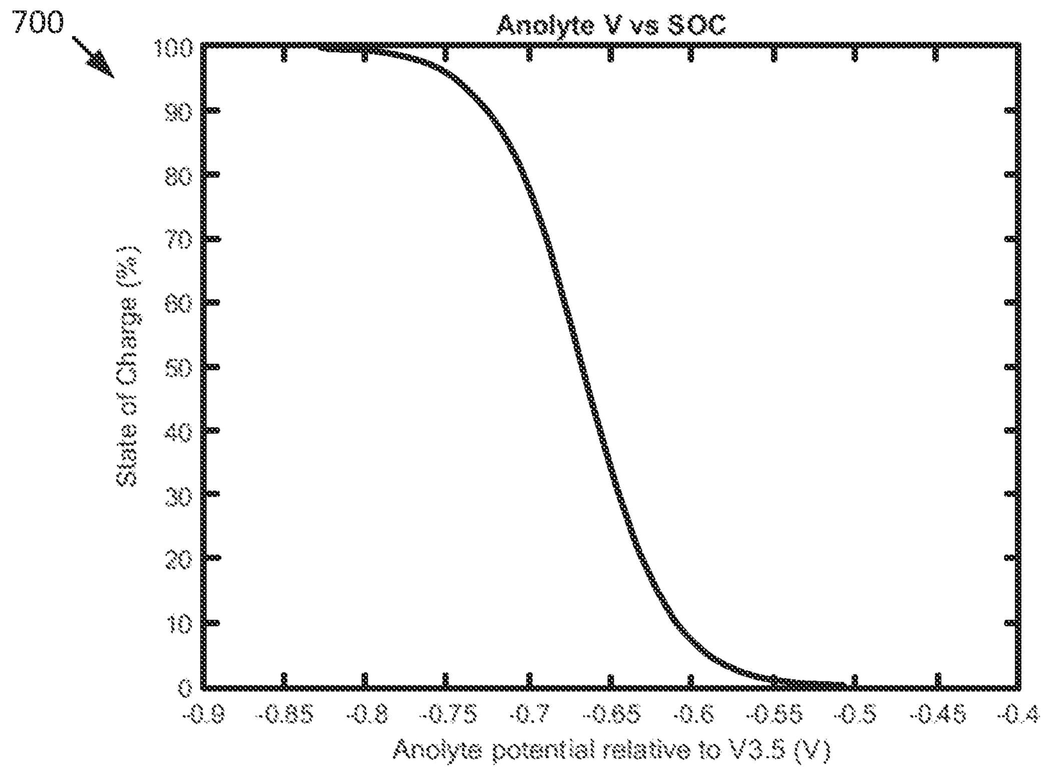
FIG. 7A is a graphical representation of the anolyte state of charge calculation.
Figure 7B:
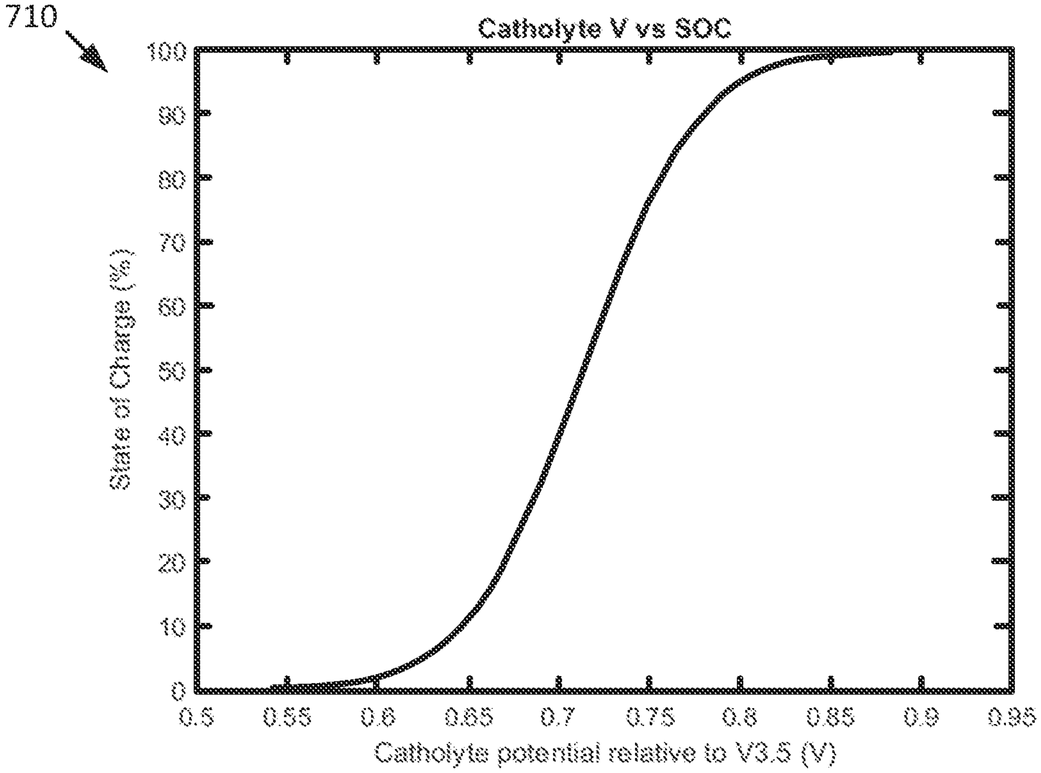
FIG. 7B is a graphical representation of the catholyte state of charge calculation.

The following describes the anolyte state of charge calculation and the catholyte state of charge calculation and reference may be had to FIGS. 7A and 7B providing graphical representations 700 and 710 thereof where the electric potential is graphed relative to the SOC in each respective figure.

Anolyte SOC Calculation

For anolyte, $E_0$=−0.27V, and C=0.026554 (e.g., at room temperature, the temperature for which the graphical representations of FIGS. 7A and 7B are generated). Further, $$[V^{2+}] = \frac{SOC_{An}}{100}; [V^{3+}] = 1 - \frac{SOC_{An}}{100}; [V^{2+}] + [V^{3+}] = 1$$

And thus, Eq. 3, the Nernst equation for anolyte, is derived from Eq. 2 as:

$$E_{An} = E_0 + Cln\left(\frac{[V^{3+}]}{[V^{2+}]}\right) \quad \text{(Eq. 3)}$$

Writing the concentrations of $[V^{2+}]$ and $[V^{3+}]$ in terms of SOC, we obtain Eq. 4 directly relating SOC to anolyte potential:

$$E_{An} = E_0 + Cln\left(\frac{100 - SOC_{An}}{SOC_{An}}\right) \quad \text{(Eq. 4)}$$

It is then possible to solve for SOC in terms of anolyte potential:

$$SOC_{An} = \frac{100}{e^{\left(\frac{E_{An} - E_0}{C}\right)} + 1} \quad \text{(Eq. 5)}$$

Catholyte SOC Calculation

For catholyte, $E_0$=0.337V, and C=0.026554. Further, $$[V^{5+}] = \frac{SOC_{Ca}}{100}; [V^{4+}] = 1 - \frac{SOC_{Ca}}{100};$$
$$[H^+] = 2.1 + \frac{SOC_{Ca}}{100}; [V^{4+}] + [V^{5+}] = 1$$

And thus, Eq. 6, the Nernst equation for catholyte, is derived from Eqs. 1 and 2 as:

$$E_{Ca} = E_0 + Cln\left(\frac{[V^{5+}][H^+]^2}{[V^{4+}]}\right) \quad \text{(Eq. 6)}$$

Writing the concentrations of $[V^{4+}]$, $[V^{5+}]$, and $[H^+]$ in terms of SOC, we obtain Eq. 7 directly relating SOC to catholyte potential:

$$E_{Ca} = E_0 + Cln\left(\frac{(SOC_{Ca})\left(2.1 + \frac{SOC_{Ca}}{100}\right)^2}{100 - SOC_{Ca}}\right) \quad \text{(Eq. 7)}$$

It is then possible to solve for SOC in terms of catholyte potential, although this is done numerically:

$$0 = 100e^{\left(\frac{E_{Ca}-E_0}{C}\right)} + \left(4.41 + e^{\left(\frac{E_{Ca}-E_0}{C}\right)}\right)SOC_{Ca} + \frac{4.2SOC_{Ca}^2}{100} + \frac{SOC_{Ca}^3}{10000}$$

In an embodiment, rather than computing SOC from the potential measure through solving operations using the Nernst Equation, the flow battery is configured to determine one or both of the anolyte and catholyte SOC using a look-up table associating respective potentials to respective SOCs that are pre-calculated. Using the look-up table may include interpolating, as may be necessary, for example, when a measured potential is between two potentials in the respective table. By way of example, the computing device is configured to perform at least one of: i) storing an anolyte look-up table associating anolyte potential difference to anolyte SOC and utilizing the loop-up table to determine the respective SOC for the anolyte; and ii) storing a catholyte look-up table associating catholyte potential difference to catholyte SOC and utilizing the look-up table to determine the respective SOC for the catholyte.

A flow battery may be configured to determine SOC in more than one manner. Determining SOC as described in accordance with the Nernst Equation (which may use a look-up operation) may yield less precise results for high or low SOC values (e.g. toward 100% or 0%). An alternative or additional way to determine SOC may be useful at these values. As noted, one additional manner to measure SOC is responsive to an optical signal providing electrolyte color. That is, the flow battery may comprise an optical sensor as shown in FIG. 1. The color measure of an electrolyte may be associated to a respective SOC, such as in a look-up table (which may involve interpolation operations as is understood by a person of skill in the art). In another manner, relative anolyte and catholyte potential differentials may be associated to SOC and stored in a table for look-up (e.g., determined via a reference cell 108). Thus in an embodiment, the computing device may be configured with options to determine SOC. One (e.g., first) option comprises processing the at least one of the anolyte potential difference (relative to the reference electrolyte) and the catholyte potential difference (relative to the reference electrolyte) according to the Nernst Equation (which may be performed using a look-up operation). Another (e.g., second) option comprises using colour measures to determine SOC. Another (e.g., third) option comprises using relative anolyte catholyte potential differences (which may be performed using a look-up operation). In an embodiment, a computing device (e.g., 222) is configured to determine SOC according to the first option and one of the second and third options. The labels "first", "second" and "third" herein are not necessarily following an order of operations or a preference but are used to distinguish different options.

Figure 8:
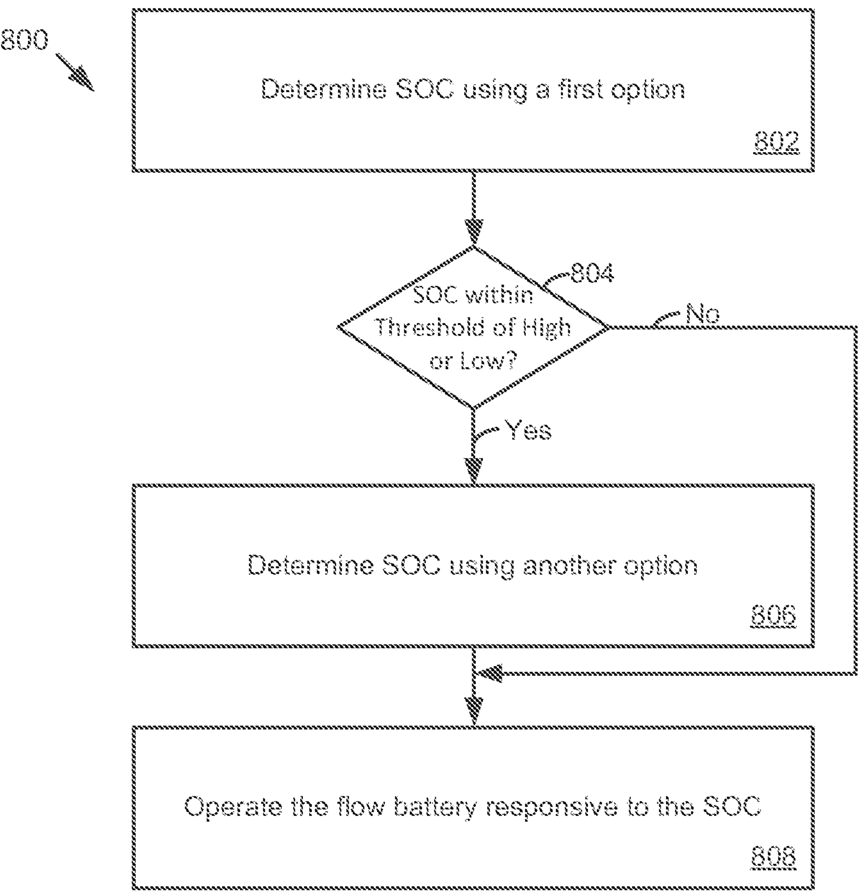
FIG. 8 is a flowchart of operations in accordance with an embodiment herein.

In an embodiment, as shown in FIG. 8, a computing device (e.g., 222) is configured to perform a method 800 where at 802, the device determines SOC according to the first option. At 804 a decision is made whether the SOC is within a threshold of a high value (e.g., 100%) or a low value (e.g. 0%). Equivalently, the decision is whether the SOC is within a mid-range between 100% and 0% excluding an amount at each end. If the result is within a threshold amount of a high or low SOC, via "Yes" branch to 806, the flow battery determines SOC using another option and, at 808, uses the SOC determined using another option, for example, when determining a control operation (e.g., operates the flow batter responsive to the SOC). If the result is not within a threshold amount of a high or low SOC, via "No" branch to 808, the flow battery uses the SOC determined using the first option, for example, when determining a control operation.

Determining Concentrations of Vanadium Atoms from SOC

In an embodiment, control system 222 is configured to determine molarities and concentrations for Vanadium atoms from SOC. The following definitions are useful, where:

$$V = \text{Volume};$$
$$M = \text{Molarity};$$
$$I = \text{Current};$$
$$SOC = \text{State of Charge};$$
$$N_A = \text{Avagadro's Number};$$
$$C = Coulomb = 6.24 * 10^{18} \text{ electrons};$$
$$F = \text{Faraday's constant} = \frac{N_A}{C} = 96485.33\frac{C}{\text{mol}};$$

In an embodiment, molarity is determined as:

$$M_{An} = \frac{I}{FV_{An}\frac{dSOC_{An}}{dt}}; \text{ and}$$
$$M_{Ca} = \frac{I}{FV_{Ca}\frac{dSOC_{Ca}}{dt}}.$$

Note that: Constant current through the measurement ensures accurate measurements of concentration. In an embodiment, control system 222 (the device that controls power at the battery cell) is configured to keep the current constant by adjusting the voltage until the desired current is reached. Further, this calculation can be used for an ideal case. For more accurate measurements, coulombic losses due to shunt current and ion cross-over may be considered.

Alternatively, in an embodiment, rates of change of SOC on both anolyte and catholyte sides of the system are compared to determine the mol percentage of each, where:

$$\Delta AnSOC = \frac{[V2] + \Delta Chg}{[Van]} - \frac{[V2]}{[Van]} = \frac{\Delta Chg}{[Van]};$$
$$\Delta CaSOC = \frac{[V5] + \Delta Chg}{[Vca]} - \frac{[V5]}{[Vca]} = \frac{\Delta Chg}{[Vca]};$$
$$\Delta AnSOC \cdot [Van] = \Delta CaSOC \cdot [Vca];$$
$$\frac{[Van]}{[Vca]} = \frac{\Delta CaSOC}{\Delta AnSOC};$$

$$AnMolPct = \frac{[Van]}{[Van] + [Vca]} = \frac{\frac{[Van]}{[Vca]}}{\frac{[Van]}{[Vca]} + 1} = \frac{\frac{\Delta CaSOC}{\Delta AnSOC}}{\frac{\Delta CaSOC}{\Delta AnSOC} + 1} = \frac{\Delta CaSOC}{\Delta AnSOC + \Delta CaSOC}; \textit{ and}$$

-continued $$CaMolPCt = \frac{[Vca]}{[Van]+[Vca]} = \frac{\frac{[Vca]}{[Van]}}{1+\frac{[Vca]}{[Van]}} = \frac{\frac{\Delta AnSOC}{\Delta CaSOC}}{\frac{\Delta AnSOC}{\Delta CaSOC}+1}. = \frac{\Delta AnSOC}{\Delta AnSOC+\Delta CaSOC}$$

Note that: Constant current through the measurement ensures accurate measurements of concentration. In an embodiment, control system 222 (the device that controls power at the battery cell) is configured to keep the current constant by adjusting the voltage until the desired current is reached. Further, this calculation can be used for an ideal case. For more accurate measurements, coulombic losses due to shunt current and ion cross-over may be considered.

Calculating Active Species Concentrations and Oxidation State

Having obtained SOCs and molarities for anolyte and catholyte, in an embodiment, concentrations of $V^{2+}$, $V^{3+}$, $V^{4+}$, and $V^{5+}$ are calculated where:

$$[V^{2+}] = M_{An} * \frac{SOC_{An}}{100};$$

$$[V^{3+}] = M_{An} * \left(1 - \frac{SOC_{An}}{100}\right);$$

$$[V^{4+}] = M_{Ca} * \left(1 - \frac{SOC_{Ca}}{100}\right); \text{ and}$$

$$[V^{5+}] = M_{Ca} * \frac{SOC_{Ca}}{100}.$$

With molarities and SOCs obtained, one can also measure the overall oxidation state of the electrolyte. In an embodiment, this is performed by the following equation:

$$\text{Oxidation State} = \frac{M_{An} * (2 * SOC_{An} + 3 * (1 - SOC_{An})) + M_{Ca} * (5 * SOC_{Ca} + 4 * (1 - SOC_{Ca}))}{M_{An} + M_{Ca}} \quad \text{(Eq. 8)}$$

In an embodiment, Oxidation State is determined using the respective species concentrations, for example, re-writing Equation 8.

Unwanted side reactions in the battery system can result in a gradual rise in overall oxidation state. An example of such a reaction is the catalysis of hydrogen at the negative electrode, which consumes two electrons per reaction, removing them from the system where they have the potential to do useful work. An oxidation state that deviates too far from +3.5 in either direction will result in a diminished capacity for the battery to store energy. In an embodiment, the control system 222 is configured to monitor the overall oxidation state of the system so that corrective action may be performed to return the flow battery to its initial condition. One example of corrective action may include replacing the entire volume of electrolyte, however, this is undesirable as it incurs a significant additional cost.

U.S. Pat. No. 9,853,310 B2 of Darling et al., issued Dec. 26, 2017, entitled "Distribution of Electrolytes in a Flow Battery" (incorporated herein by reference) discloses a method of determining a distribution of electrolytes in a flow battery. In an embodiment such as shown in FIGS. 1-3, a flow battery is provided with a fixed amount of fluid electrolyte having a common electrochemically active specie such as vanadium, iron, chromium, etc. The electrolyte is divided in a proportion as an anolyte and a catholyte. An average oxidation state (AOS) of the common electrochemically active specie is determined in the anolyte and the catholyte. In accordance with an embodiment herein, the AOS is determined as described using SOC as measured and determined as described herein. In response to the determined AOS, a molar ratio of the common electrochemically active specie between the anolyte and the catholyte can be adjusted to increase an energy discharge capacity of the flow battery for the determined average oxidation state (or molar ratios).

In an embodiment herein, instant AOS is determined such as by using SOC as newly described herein. The term "instant" means a current instance or value of a particular determination. The flow battery is configured to control its operations, for example to adjust an instant molar ratio (e.g., a current value of the molar ratio) of the common electrochemically active specie between the anolyte and the catholyte. Controlling the ratio seeks to increase a relative energy discharge capacity for the current value of the AOS. It will be understood that the relative energy discharge capacity is a current value of energy discharge capacity based on the current value of the molar ratio relative to a maximum capacity. Max. capacity is based on a fully balanced molar ratio between the anolyte and the catholyte. In an embodiment, adjusting comprises partially mixing the anolyte and the catholyte together into non-equal volumes of the anolyte and the catholyte in the flow battery.

US20160056487A1 of Darling et al., published Feb. 25, 2016, entitled "Method of maintaining health of a flow battery" (incorporated herein by reference) discloses a method of maintaining health of a flow battery. Such a method includes determining an average oxidation state of a common electrochemically active elemental specie in first and second fluid electrolytes (e.g. anolyte and catholyte) on, respectively, a negative side and a positive side of an electrochemical cell of a flow battery, and adjusting the average oxidation state in response to the average oxidation state deviating from a predefined average oxidation state value.

In an embodiment herein, instant AOS is determined using SOC as newly described herein and the flow battery is configured to control its operations to maintain health by adjusting the average oxidation state in response to the average oxidation state deviating from a predefined average oxidation state value (which may be an average oxidation state range). In an embodiment, the specie is selected from vanadium, iron, and chromium. In an embodiment herein, adjusting the average comprises adding a reducing agent to the catholyte to reduce a valence state of the common electrochemically active elemental specie in the catholyte. The reducing agent may comprise an acid such as, an oxalic acid or a formic acid and, alternatively or in addition, an alcohol. In an embodiment herein, adjusting the average comprises adding an oxidizing agent to the anolyte to increase a valence state of the common electrochemically active elemental specie in the anolyte. The oxidizing agent may comprise an oxygen gas, such as air, and/or a hydrogen peroxide. In an embodiment, the average oxidation state is adjusted to be either higher or lower than the predefined average oxidation state value in response to an expectation that the average oxidation state will creep toward the predefined average oxidation state value. In an embodiment, the predefined average oxidation state or range can be based upon the type of common electrochemically active species. By way of example for a value range, the value range can be +/−10% of the AOS when the common electrochemically active species are fully balanced.

Thus, in an embodiment, the flow battery (e.g., the control system thereof) is configured to at least one of determine an oxidation state of the flow battery according to the molarity of the anolyte and catholyte; and control the flow battery to manage the oxidation state. Managing the oxidation state may comprise mixing the anolyte and catholyte as described. Managing the oxidation state may comprise adding a reducing agent as described. Managing the oxidation state may comprise adding an oxidizing agent as described.

Though described with reference to a VRFB, other electrolytes may be used. Non-limiting examples of suitable electrolyte solution pairs can include vanadium and vanadium solutions, bromine and polysulfide solutions, vanadium and bromide solutions, and any other solutions. The electrolyte solutions can be based on vanadium, bromine, iron, chromium, zinc, cerium, lead, sulfur, cobalt, tin and manganese or any suitable combinations thereof. Suitable adaptations may be made to the equations and values therefor as described herein.

The flow battery can comprise: at least one electrochemical battery cell in fluid communication with an anolyte electrolyte and a catholyte electrolyte; a reference cell in fluid communication with at least one of the anolyte electrolyte and the catholyte electrolyte and in fluid communication with a reference electrolyte having a known electric potential, the reference cell to measure at least one of i) an anolyte potential difference, across the reference cell, between the anolyte electrolyte and the reference electrolyte, and ii) a catholyte potential difference, across the reference cell, between the catholyte electrolyte and the reference electrolyte; and a computing device comprising circuitry configured to: process the at least one of the anolyte potential difference and the catholyte potential difference to determine a respective state of charge (SOC) of the anolyte electrolyte and catholyte electrolyte for controlling operation of the flow battery, the computing device determining the respective SOC without a measurement of the potential difference between the anolyte electrolyte and the catholyte electrolyte. The computing device can be configured to determine the respective SOC in accordance with a Nernst equation of the form:

$$E = E_0 - \frac{RT}{zF}\ln(Q), \quad \text{(Eq. 1)}$$

wherein $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

The computing device can be configured to, at least one of: i) store an anolyte look-up table associating anolyte potential difference to anolyte SOC and utilize the look-up table to determine the respective SOC; and ii) store a catholyte look-up table associating catholyte potential difference to catholyte SOC and utilize the look-up table to determine the respective SOC. To process the at least one of the anolyte potential difference and the catholyte potential difference to determine the respective state of charge (SOC) can define a first SOC determining option and wherein the computing device can be further configured to determine the respective SOC in a second SOC determining option, wherein, in the second SOC determining option, the computing device can be configured to perform, one of: a) determining the respective SOC in response to an optical signal measuring an electrolyte colour; and b) processing a potential difference between the anolyte and catholyte and determine the respective SOC in response. The computing device can be configured to determine the respective SOC in accordance with the first SOC determining option and if the respective SOC is within a threshold of a high or low value, determine the respective SOC in accordance with the second SOC determining option for use to control the operation of the flow battery. The reference cell can comprise respective bodies to separately receive electrolyte. The reference cell can comprise a first reference cell configured to receive one of the anolyte and catholyte and wherein the flow battery comprises a second reference cell, separate from the first reference cell, the second reference cell configured to receive the other one of the anolyte and catholyte, wherein: the first reference cell can comprise a first anolyte cell body to separately receive the anolyte electrolyte and a first reference electrolyte cell body to separately receive the reference electrolyte; and wherein a first membrane can separate the first anolyte cell body and the first reference electrolyte cell body; and the second reference cell can comprise a first catholyte cell body to separately receive the catholyte electrolyte and a second reference electrolyte cell body to separately receive the reference electrolyte; and wherein a second membrane can separate the first catholyte cell body and the second reference electrolyte cell body, wherein the computing device can receive measurements of potential differences from each of the first reference cell and the second reference cell. The flow battery can comprise: an anolyte electrolyte loop to circulate the anolyte electrolyte to the at least one battery cell and the first reference cell; a catholyte electrolyte loop to circulate the catholyte electrolyte to the at least one battery cell and the second reference cell; and a reference electrolyte loop to circulate the reference electrolyte to each of the first reference cell and the second reference cell. The reference cell of the flow battery can be configured for fluid communication with each of the anolyte electrolyte and the catholyte electrolyte; the reference cell can comprise a first cell body to separately receive the anolyte electrolyte, a second cell body to separately receive the catholyte electrolyte and at least one additional cell body to separately receive the reference electrolyte; a first membrane can separate the first cell body and the at least one additional cell body; and a second membrane can separate the second cell body and the at least one additional cell body. The at least one additional cell body can comprise a first additional cell body and a second additional cell body to receive the reference electrolyte and wherein the first additional cell body and the second additional cell body can comprise a membrane therebetween. The flow battery can comprise: an anolyte electrolyte loop to circulate the anolyte electrolyte to the at least one battery cell and the first cell body; a catholyte electrolyte loop to circulate the catholyte electrolyte to the at least one battery cell and the second cell body; and a reference electrolyte loop to circulate the reference electrolyte to the at least one additional cell body. The computing device can be further configured to determine molarities and concentrations for electrolyte atoms from SOC, wherein a molarity of the anolyte and catholyte can be determined as:

$$M_{An}=\frac{I}{FV_{An}\frac{dSOC_{An}}{dt}};\text{ and }M_{Ca}=\frac{I}{FV_{Ca}\frac{dSOC_{Ca}}{dt}};$$

wherein: $V$ = Volume; $M$ = Molarity; $I$ = Current;

$SOC$ = State of Charge; $N_A$ = Avagadro's Number;

$C$ = Coulomb = $6.24*10^{18}$ electrons; and $$F=\text{Faraday's constant}=\frac{N_A}{C}=96485.33\ \frac{C}{\text{mol}}.$$

The flow battery can comprise a Vanadium Redox Flow Battery (VRFB). The anolyte electrolyte and catholyte electrolyte can comprise electrolyte solution pairs selected from vanadium, bromine, iron, chromium, zinc, cerium, lead, sulfur, cobalt, tin, and manganese, or any suitable combinations thereof. The computing device can be configured to control the operation of the flow battery by, at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site. The computing device can be configured to, at least one of: i) determining an oxidation state of the flow battery according to the molarity of the anolyte and catholyte; and ii) determining an oxidation state of the flow battery according to the molarity of the anolyte and catholyte; and controlling the flow battery to manage the oxidation state.

A method to control a flow battery can comprise: circulating an anolyte electrolyte and a catholyte electrolyte through at least one electrochemical battery cell; circulating a reference electrolyte having a known electric potential through a reference cell in fluid communication with at least one of the anolyte electrolyte and the catholyte electrolyte; measuring at least one of i) an anolyte potential difference, across the reference cell, between the anolyte electrolyte and the reference electrolyte, and ii) a catholyte potential difference, across the reference cell, between the catholyte electrolyte and the reference electrolyte; processing the at least one of the anolyte potential difference and the catholyte potential difference to determine a respective state of charge (SOC) of the anolyte electrolyte and catholyte electrolyte for controlling operation of the flow battery, the method determining the respective SOC without a measurement of the potential difference between the anolyte electrolyte and the catholyte electrolyte. To determine the respective SOC can comprise determining the respective SOC in accordance with a Nernst equation of the form:

$$E=E_0-\frac{RT}{zF}\ln(Q),\qquad\text{(Eq. 1)}$$

wherein $E$ = reduction potential;

$E_0$ = standard potential; $R$ = gas constant;

$T$ = Temperature; $z$ = ion charge;

$F$ = Faraday's constant;

$Q$ = reaction quotient; and $\frac{RT}{zF}=C$.

The method can comprise, at least one of: i) storing an anolyte look-up table associating anolyte potential difference to anolyte SOC and utilizing the look-up table to determine the respective SOC; and ii) storing a catholyte look-up table associating catholyte potential difference to catholyte SOC and utilizing the look-up table to determine the respective SOC. The processing the at least one of the anolyte potential difference and the catholyte potential difference to determine the respective state of charge (SOC) can define a first SOC determining option and wherein the method can further comprise determining the respective SOC according to a second SOC determining option, wherein, according to the second SOC determining option, the method can comprise one of: a) determining the respective SOC in response to an optical signal measuring an electrolyte colour; and b) processing a potential difference between the anolyte and catholyte and determine the respective SOC in response. The method can determine the respective SOC in accordance with the first SOC determining option and if the respective SOC is within a threshold of a high or low value, can determine the respective SOC in accordance with the second SOC determining option for use to control the operation of the flow battery. The method can further comprise determining at least one molarity for electrolyte atoms from the respective SOC, wherein a molarity of the anolyte and catholyte can be determined as:

$$M_{An}=\frac{I}{FV_{An}\frac{dSOC_{An}}{dt}};\text{ and }M_{Ca}=\frac{I}{FV_{Ca}\frac{dSOC_{Ca}}{dt}};$$

wherein: $V$ = Volume; $M$ = Molarity; $I$ = Current;

$SOC$ = State of Charge; $N_A$ = Avagadro's Number;

$C$ = Coulomb = $6.24*10^{18}$ electrons; and $$F=\text{Faraday's constant}=\frac{N_A}{C}=96485.33\ \frac{C}{\text{mol}}.$$

The method can comprise at least one of: i) determining an oxidation state of the flow battery according to the molarity of the anolyte and catholyte; and ii) determining an oxidation state of the flow battery according to the molarity of the anolyte and catholyte; and controlling the flow battery to manage the oxidation state. The flow battery can comprise a Vanadium Redox Flow Battery (VRFB). The anolyte electrolyte and catholyte electrolyte can comprise electrolyte solution pairs selected from vanadium, bromine, iron, chromium, zinc, cerium, lead, sulfur, cobalt, tin, and manganese, or any suitable combinations thereof. The method can comprise controlling operation of the flow battery by at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site.

A computer program product can comprise a non-transitory storage medium storing computer readable instructions that, when executed by a processor, cause the processor to perform a method in accordance with any of the foregoing methods.

This disclosure further encompasses the following embodiments.

Embodiment 1: A flow battery comprising: at least one electrochemical battery cell in fluid communication with an anolyte electrolyte and a catholyte electrolyte; a reference cell in fluid communication with at least one of the anolyte electrolyte and the catholyte electrolyte and in fluid communication with a reference electrolyte having a known electric potential, the reference cell to measure at least one of i) an anolyte potential difference, across the reference cell, between the anolyte electrolyte and the reference electrolyte, and ii) a catholyte potential difference, across the reference cell, between the catholyte electrolyte and the reference electrolyte; and a computing device comprising circuitry configured to: process the at least one of the anolyte potential difference and the catholyte potential difference to determine a respective state of charge (SOC) of the anolyte electrolyte and catholyte electrolyte for controlling operation of the flow battery, the computing device determining the respective SOC without a measurement of the potential difference between the anolyte electrolyte and the catholyte electrolyte.

Embodiment 2: The flow battery of embodiment 1, wherein the computing device is configured to determine the respective SOC in accordance with a Nernst equation of the form:

$$E = E_0 - \frac{RT}{zF}\ln(Q), \quad \text{(Eq. 1)}$$

wherein $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

Embodiment 3: The flow battery of embodiment 2, wherein the computing device is configured to, at least one of: i) store an anolyte look-up table associating anolyte potential difference to anolyte SOC and utilize the look-up table to determine the respective SOC; and ii) store a catholyte look-up table associating catholyte potential difference to catholyte SOC and utilize the look-up table to determine the respective SOC.

Embodiment 4: The flow battery of any one of embodiments 1 to 3, wherein to process the at least one of the anolyte potential difference and the catholyte potential difference to determine the respective state of charge (SOC) defines a first SOC determining option and wherein the computing device is further configured to determine the respective SOC in a second SOC determining option.

Embodiment 5: The flow battery of embodiment 4, wherein, in the second SOC determining option, the computing device is configured to perform, one of: a) determining the respective SOC in response to an optical signal measuring an electrolyte colour; and b) processing a potential difference between the anolyte and catholyte and determine the respective SOC in response.

Embodiment 6: The flow battery of embodiment 4 or 5 wherein the computing device is configured to determine the respective SOC in accordance with the first SOC determining option and if the respective SOC is within a threshold of a high or low value, determine the respective SOC in accordance with the second SOC determining option for use to control the operation of the flow battery.

Embodiment 7: The flow battery of any one of embodiments 1 to 6, wherein the reference cell comprises respective bodies to separately receive electrolyte.

Embodiment 8: The flow battery of any one of embodiments 1 to 7, wherein the reference cell comprises a first reference cell configured to receive one of the anolyte and catholyte and wherein the flow battery comprises a second reference cell, separate from the first reference cell, the second reference cell configured to receive the other one of the anolyte and catholyte.

Embodiment 9: The flow battery of embodiment 8, wherein: the first reference cell comprises a first anolyte cell body to separately receive the anolyte electrolyte and a first reference electrolyte cell body to separately receive the reference electrolyte; and wherein a first membrane separates the first anolyte cell body and the first reference electrolyte cell body; and the second reference cell comprises a first catholyte cell body to separately receive the catholyte electrolyte and a second reference electrolyte cell body to separately receive the reference electrolyte; and wherein a second membrane separates the first catholyte cell body and the second reference electrolyte cell body.

Embodiment 10: The flow battery of embodiment 8 or 9, wherein the computing device receives measurements of potential differences from each of the first reference cell and the second reference cell.

Embodiment 11: The flow battery of any one of embodiments 8 to 10, comprising: an anolyte electrolyte loop to circulate the anolyte electrolyte to the at least one battery cell and the first reference cell; a catholyte electrolyte loop to circulate the catholyte electrolyte to the at least one battery cell and the second reference cell; and a reference electrolyte loop to circulate the reference electrolyte to each of the first reference cell and the second reference cell.

Embodiment 12: The flow battery of embodiment 7, wherein: the reference cell is configured for fluid communication with each of the anolyte electrolyte and the catholyte electrolyte; the reference cell comprises a first cell body to separately receive the anolyte electrolyte, a second cell body to separately receive the catholyte electrolyte and at least one additional cell body to separately receive the reference electrolyte; a first membrane separates the first cell body and the at least one additional cell body; and a second membrane separates the second cell body and the at least one additional cell body.

Embodiment 13: The flow battery of embodiment 12, wherein the at least one additional cell body comprises a first additional cell body and a second additional cell body to receive the reference electrolyte and wherein the first additional cell body and the second additional cell body comprise a membrane therebetween.

Embodiment 14: The flow battery of embodiment 12 or 13, comprising: an anolyte electrolyte loop to circulate the anolyte electrolyte to the at least one battery cell and the first cell body; a catholyte electrolyte loop to circulate the catholyte electrolyte to the at least one battery cell and the second cell body; and a reference electrolyte loop to circulate the reference electrolyte to the at least one additional cell body.

Embodiment 15: The flow battery of any one of embodiments 1 to 14, wherein the computing device is further configured to determine molarities and concentrations for electrolyte atoms from SOC.

Embodiment 16: The flow battery of embodiment 15, wherein a molarity of the anolyte and catholyte is determined as:

$$M_{An} = \frac{I}{FV_{An}\frac{dSOC_{An}}{dt}};$$

-continued and $$M_{Ca} = \frac{I}{FV_{Ca}\frac{dSOC_{Ca}}{dt}};$$

wherein:

$V$ = Volume;

$M$ = Molarity;

$I$ = Current;

$SOC$ = State of Charge;

$N_A$ = Avagadro's Number;

$C$ = Coulomb = $6.24*10^{18}$ electrons; and $$F = \text{Faraday's constant} = \frac{N_A}{C} = 96485.33\ \frac{C}{\text{mol}}.$$

Embodiment 17: The flow battery of any one of embodiments 1 to 16 comprising a Vanadium Redox Flow Battery (VRFB).

Embodiment 18: The flow battery of any one of embodiments 1 to 16, wherein the anolyte electrolyte and catholyte electrolyte comprise electrolyte solution pairs selected from vanadium, bromine, iron, chromium, zinc, cerium, lead, sulfur, cobalt, tin, and manganese, or any suitable combinations thereof.

Embodiment 19: The flow battery of any one of embodiments 1 to 18, wherein the computing device is configured to control the operation of the flow battery by, at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site.

Embodiment 20: The flow battery of any one of embodiments 1 to 19, wherein the computing device is configured to, at least one of: i) determining an oxidation state of the flow battery according to the molarity of the anolyte and catholyte; and ii) determining an oxidation state of the flow battery according to the molarity of the anolyte and catholyte; and controlling the flow battery to manage the oxidation state.

Embodiment 21: A method to control a flow battery, the method comprising: circulating an anolyte electrolyte and a catholyte electrolyte through at least one electrochemical battery cell; circulating a reference electrolyte having a known electric potential through a reference cell in fluid communication with at least one of the anolyte electrolyte and the catholyte electrolyte; measuring at least one of i) an anolyte potential difference, across the reference cell, between the anolyte electrolyte and the reference electrolyte, and ii) a catholyte potential difference, across the reference cell, between the catholyte electrolyte and the reference electrolyte; processing the at least one of the anolyte potential difference and the catholyte potential difference to determine a respective state of charge (SOC) of the anolyte electrolyte and catholyte electrolyte for controlling operation of the flow battery, the method determining the respective SOC without a measurement of the potential difference between the anolyte electrolyte and the catholyte electrolyte.

Embodiment 22: The method of embodiment 21, wherein to determine the respective SOC comprises determining the respective SOC in accordance with a Nernst equation of the form:

$$E = E_0 - \frac{RT}{zF}\ln(Q), \qquad \text{(Eq. 1)}$$

wherein $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

Embodiment 23: The method of embodiment 22, comprising, at least one of: i) storing an anolyte look-up table associating anolyte potential difference to anolyte SOC and utilizing the look-up table to determine the respective SOC; and ii) storing a catholyte look-up table associating catholyte potential difference to catholyte SOC and utilizing the look-up table to determine the respective SOC.

Embodiment 24: The method of any one of embodiments 21 to 23, wherein processing the at least one of the anolyte potential difference and the catholyte potential difference to determine the respective state of charge (SOC) defines a first SOC determining option and wherein the method further comprises determining the respective SOC according to a second SOC determining option, Embodiment 25: The method of embodiment 24, wherein, according to the second SOC determining option, the method comprises one of: a) determining the respective SOC in response to an optical signal measuring an electrolyte colour; and b) processing a potential difference between the anolyte and catholyte and determine the respective SOC in response.

Embodiment 26: The method of embodiment 24 or 25 wherein the method determines the respective SOC in accordance with the first SOC determining option and if the respective SOC is within a threshold of a high or low value, determines the respective SOC in accordance with the second SOC determining option for use to control the operation of the flow battery.

Embodiment 27: The method of any one of embodiments 21 to 26 further comprising determining at least one molarity for electrolyte atoms from the respective SOC.

Embodiment 28: The method of embodiment 27, wherein a molarity of the anolyte and catholyte is determined as:

$$M_{An} = \frac{I}{FV_{An}\frac{dSOC_{An}}{dt}};$$

and $$M_{Ca} = \frac{I}{FV_{Ca}\frac{dSOC_{Ca}}{dt}};$$

wherein:

$V$ = Volume;

$M$ = Molarity;

$I$ = Current;

-continued $SOC$ = State of Charge;

$N_A$ = Avagadro's Number;

$C$ = Coulomb = $6.24*10^{18}$ electrons; and $$F = \text{Faraday's constant} = \frac{N_A}{C} = 96485.33\ \frac{C}{\text{mol}}.$$

Embodiment 29: The method of any one of embodiments 21 to 28 comprising at least one of: i) determining an oxidation state of the flow battery according to the molarity of the anolyte and catholyte; and ii) determining an oxidation state of the flow battery according to the molarity of the anolyte and catholyte; and controlling the flow battery to manage the oxidation state.

Embodiment 30: The method of any one of embodiments 21 to 29, wherein the flow battery comprises a Vanadium Redox Flow Battery (VRFB).

Embodiment 31: The method of any one of embodiments 21 to 29, wherein the anolyte electrolyte and catholyte electrolyte comprise electrolyte solution pairs selected from vanadium, bromine, iron, chromium, zinc, cerium, lead, sulfur, cobalt, tin, and manganese, or any suitable combinations thereof.

Embodiment 32: The method of any one of embodiments 21 to 31, comprising controlling operation of the flow battery by at least one of: controlling application of external power to charge the flow battery; controlling application of power from the battery to discharge the battery; matching the respective state of charge of the anolyte and the catholyte to one another; and matching the respective state of charge of the anolyte and the catholyte in the flow battery to that of another flow battery coupled in a string or co-located at a same site.

Embodiment 33: A computer program product comprising a non-transitory storage medium storing computer readable instructions that, when executed by a processor, cause the processor to perform a method in accordance with any one of method embodiments 21 to 32.

Practical implementation may include any or all of the features described herein. These and other aspects, features and various combinations may be expressed as methods, apparatus, systems, means for performing functions, program products, and in other ways, combining the features described herein. A number of embodiments have been described. Nevertheless, it will be understood that various modifications can be made without departing from the spirit and scope of the processes and techniques described herein. In addition, other steps can be provided, or steps can be eliminated, from the described process, and other components can be added to, or removed from, the described systems. Accordingly, other embodiments are within the scope of the following claims.

Throughout the description and claims of this specification, the word "comprise" and "contain" and variations of them mean "including but not limited to" and they are not intended to (and do not) exclude other components, integers or steps. Throughout this specification, the singular encompasses the plural unless the context requires otherwise. In particular, where the indefinite article is used, the specification is to be understood as contemplating plurality as well as singularity, unless the context requires otherwise.

Features, integers, characteristics, or groups described in conjunction with a particular aspect, embodiment or example of the invention are to be understood to be applicable to any other aspect, embodiment or example unless incompatible therewith. All of the features disclosed herein (including any accompanying claims, abstract and drawings), and/or all of the steps of any method or process so disclosed, may be combined in any combination, except combinations where at least some of such features and/or steps are mutually exclusive. The invention is not restricted to the details of any foregoing examples or embodiments. The invention extends to any novel one, or any novel combination, of the features disclosed in this specification (including any accompanying claims, abstract and drawings) or to any novel one, or any novel combination, of the steps of any method or process disclosed.

References (incorporated herein by reference where permitted).

1. US20180375132A1 of Li et al., published Dec. 27, 2018, entitled "Reference Open-Circuit-Voltage Cell for Redox Flow Battery."
2. US20190280316A1 of Min et al., published Sep. 12, 2019, entitled "Method and device for recycling electrolyte of flow battery."
3. US20110311896 of Harper et al., published entitled "Integrated system for electrochemical energy storage system."
4. Direct Measurement of Vanadium Crossover in an Operating Vanadium Redox Flow Battery; D. C Sing and J. P. Meyers, 2013 ECS Trans. 50 61.
5. Transference Numbers of Vanadium Cations in Nafion; R. M. Darling et al 2020, J. Electrochem Soc. 167 020429.
6. US20160056487A1 of Darling et al., published Feb. 25, 2016, entitled "Method of maintaining health of a flow battery."
7. U.S. Pat. No. 9,853,310 B2 of Darling et al., issued Dec. 26, 2017, entitled "Distribution of Electrolytes in a Flow Battery."

What is claimed is:

1. A flow battery comprising:

at least one electrochemical battery cell in fluid communication with an anolyte electrolyte and a catholyte electrolyte;

a reference cell in fluid communication with at least one of the anolyte electrolyte and the catholyte electrolyte and in fluid communication with a reference electrolyte having a known electric potential, the reference cell measures at least one of i) an anolyte potential difference, across the reference cell, between the anolyte electrolyte and the reference electrolyte, and ii) a catholyte potential difference, across the reference cell, between the catholyte electrolyte and the reference electrolyte; and a computing device in communication with the reference cell, the computing device comprising circuitry configured to:

process the at least one of the anolyte potential difference and the catholyte potential difference to determine a respective state of charge (SOC) of the anolyte electrolyte and catholyte electrolyte for controlling operation of the flow battery, the computing device determining the respective SOC without a measurement of the potential difference between the anolyte electrolyte and the catholyte electrolyte.

2. The flow battery of claim 1, wherein the computing device is configured to determine the respective SOC in accordance with a Nernst equation of the form:

$$E = E_0 - \frac{RT}{zF}\ln(Q), \quad \text{(Eq. 1)}$$

wherein $E$ = reduction potential;

$E_0$ = standard potential; $R$ = gas constant;

$T$ = Temperature; $z$ = ion charge;

$F$ = Faraday's constant; $Q$ = reaction quotient; and $$\frac{RT}{zF} = C.$$

3. The flow battery of claim 2, wherein the computing device is configured to, at least one of:

i) store an anolyte look-up table associating anolyte potential difference to anolyte SOC and utilize the look-up table to determine the respective SOC; and ii) store a catholyte look-up table associating catholyte potential difference to catholyte SOC and utilize the look-up table to determine the respective SOC.

4. The flow battery of claim 1, wherein to process the at least one of the anolyte potential difference and the catholyte potential difference to determine the respective state of charge (SOC) defines a first SOC determining option and wherein the computing device is further configured to determine the respective SOC in a second SOC determining option, wherein, in the second SOC determining option, the computing device is configured to perform, one of:

a. determining the respective SOC in response to an optical signal measuring an electrolyte colour; and b. processing a potential difference between the anolyte and catholyte and determine the respective SOC in response.

5. The flow battery of claim 4, wherein the computing device is configured to determine the respective SOC in accordance with the first SOC determining option and if the respective SOC is within a threshold of a high or low value, determine the respective SOC in accordance with the second SOC determining option for use to control the operation of the flow battery.

6. The flow battery of claim 1, wherein the reference cell comprises respective bodies to separately receive electrolyte.

7. The flow battery of claim 6, wherein:

the reference cell is configured for fluid communication with each of the anolyte electrolyte and the catholyte electrolyte;

the reference cell comprises a first cell body to separately receive the anolyte electrolyte, a second cell body to separately receive the catholyte electrolyte and at least one additional cell body to separately receive the reference electrolyte;

a first membrane separates the first cell body and the at least one additional cell body; and a second membrane separates the second cell body and the at least one additional cell body.

8. The flow battery of claim 7, wherein the at least one additional cell body comprises a first additional cell body and a second additional cell body to receive the reference electrolyte and wherein the first additional cell body and the second additional cell body comprise a membrane therebetween.

9. The flow battery of claim 7, comprising:

an anolyte electrolyte loop to circulate the anolyte electrolyte to the at least one battery cell and the first cell body;

a catholyte electrolyte loop to circulate the catholyte electrolyte to the at least one battery cell and the second cell body; and a reference electrolyte loop to circulate the reference electrolyte to the at least one additional cell body.

10. The flow battery of claim 1, wherein the reference cell comprises a first reference cell configured to receive one of the anolyte and catholyte and wherein the flow battery comprises a second reference cell, separate from the first reference cell, the second reference cell configured to receive the other one of the anolyte and catholyte, wherein:

the first reference cell comprises a first anolyte cell body to separately receive the anolyte electrolyte and a first reference electrolyte cell body to separately receive the reference electrolyte; and wherein a first membrane separates the first anolyte cell body and the first reference electrolyte cell body; and the second reference cell comprises a first catholyte cell body to separately receive the catholyte electrolyte and a second reference electrolyte cell body to separately receive the reference electrolyte; and wherein a second membrane separates the first catholyte cell body and the second reference electrolyte cell body, wherein the computing device receives measurements of potential differences from each of the first reference cell and the second reference cell.

11. The flow battery of claim 10, comprising:

an anolyte electrolyte loop to circulate the anolyte electrolyte to the at least one battery cell and the first reference cell;

a catholyte electrolyte loop to circulate the catholyte electrolyte to the at least one battery cell and the second reference cell; and a reference electrolyte loop to circulate the reference electrolyte to each of the first reference cell and the second reference cell.

12. The flow battery of claim 1, wherein the computing device is further configured to determine molarities and concentrations for electrolyte atoms from SOC, wherein a molarity of the anolyte and catholyte is determined as:

$$M_{An} = \frac{I}{FV_{An}\frac{dSOC_{An}}{dt}};$$

and $$M_{Ca} = \frac{I}{FV_{Ca}\frac{dSOC_{Ca}}{dt}};$$

wherein:

$V$ = Volume;

$M$ = Molarity;

$I$ = Current;

$SOC$ = State of Charge;

$N_A$ = Avagadro's Number;

$C$ = Coulomb = $6.24 * 10^{18}$ electrons; and $$F = \text{Farday's constant} = \frac{N_A}{C} = 96485.33\ \frac{C}{\text{mol}}.$$

13. The flow battery of claim 1, comprising a Vanadium Redox Flow Battery (VRFB).

14. The flow battery of claim 1, wherein the anolyte electrolyte and catholyte electrolyte comprise electrolyte solution pairs selected from vanadium, bromine, iron, chromium, zinc, cerium, lead, sulfur, cobalt, tin, and manganese, or any suitable combinations thereof.

15. The flow battery of claim 1, wherein the computing device is configured to control the operation of the flow battery by, at least one of:

controlling application of external power to charge the flow battery;

controlling application of power from the battery to discharge the battery;

matching the respective state of charge of the anolyte and the catholyte to one another; and matching the respective state of charge of the anolyte and the catholyte in the flow battery to that of another flow battery coupled in a string or co-located at a same site.

16. The flow battery of claim 1, wherein the computing device is configured to, at least one of:

i) determining an oxidation state of the flow battery according to the molarity of the anolyte and catholyte; and ii) determining an oxidation state of the flow battery according to the molarity of the anolyte and catholyte; and controlling the flow battery to manage the oxidation state.

17. The flow battery of claim 1, wherein the computing device comprises a control system, wherein the control system is coupled to a data acquisition system and the data acquisition system is coupled to the reference cell.

* * * * *